(12) United States Patent
Mikawa et al.

(10) Patent No.: US 7,157,348 B2
(45) Date of Patent: Jan. 2, 2007

(54) METHOD FOR FABRICATING CAPACITOR DEVICE

(75) Inventors: Takumi Mikawa, Shiga (JP); Yuji Judai, Kyoto (JP); Atsushi Noma, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/341,252

(22) Filed: Jan. 14, 2003

(65) Prior Publication Data

US 2003/0175999 A1 Sep. 18, 2003

(30) Foreign Application Priority Data

Mar. 15, 2002 (JP) ............................. 2002-071219

(51) Int. Cl.
*H01L 21/20* (2006.01)

(52) U.S. Cl. ................................. 438/396; 257/E21.35

(58) Field of Classification Search .................... 438/3, 438/250–256, 393–399
See application file for complete search history.

(56) References Cited

U.S. PATENT DOCUMENTS

| 5,567,640 | A | * | 10/1996 | Tseng | ......................... 438/396 |
| 5,654,222 | A | * | 8/1997 | Sandhu et al. | ................. 438/3 |
| 5,985,713 | A | * | 11/1999 | Bailey | ....................... 438/240 |
| 6,133,051 | A | * | 10/2000 | Hintermaier et al. | .......... 438/3 |
| 6,250,161 | B1 | * | 6/2001 | Khuri-Yakub et al. | ........ 73/627 |
| 6,255,157 | B1 | * | 7/2001 | Hsu et al. | .................... 438/239 |
| 6,544,857 | B1 | * | 4/2003 | Hironaka et al. | ........... 438/396 |
| 6,764,862 | B1 | * | 7/2004 | Park et al. | ..................... 438/3 |
| 6,929,997 | B1 | * | 8/2005 | Jung et al. | ................... 438/240 |
| 2002/0072192 | A1 | * | 6/2002 | Kim et al. | ................... 438/396 |
| 2002/0140103 | A1 | * | 10/2002 | Kloster et al. | .............. 257/767 |
| 2003/0096472 | A1 | * | 5/2003 | Kang et al. | ................. 438/239 |
| 2003/0119273 | A1 | * | 6/2003 | Aggarwal et al. | .......... 438/396 |

FOREIGN PATENT DOCUMENTS

| JP | 7-111318 | 4/1995 |
| JP | 7-235639 | 9/1995 |
| JP | 10-12844 | 1/1998 |
| JP | 1140776 | 2/1999 |
| JP | 11-121696 | 4/1999 |
| JP | 11-121704 | 4/1999 |
| JP | 11-297946 A | 10/1999 |
| JP | P2000-91531 A | 3/2000 |
| JP | 2000-232210 A | 8/2000 |
| JP | P2001-237402 A | 8/2001 |
| JP | P2002-43310 A | 2/2002 |

* cited by examiner

*Primary Examiner*—Scott B. Geyer
(74) *Attorney, Agent, or Firm*—McDermott Will & Emery LLP

(57) ABSTRACT

After a capacitor device including a lower electrode, a capacitor dielectric film made from a ferroelectric film and an upper electrode is formed on a substrate, an insulating film covering the capacitor device is formed. Subsequently, the capacitor device covered with the insulating film is annealed for crystallizing the ferroelectric film.

23 Claims, 7 Drawing Sheets

METHOD FOR FABRICATING CAPACITOR DEVICE

BACKGROUND OF THE INVENTION

The present invention relates to a method for fabricating a capacitor device including a capacitor dielectric film made from a ferroelectric film, and more particularly, it relates to a technique to prevent characteristic degradation of a ferroelectric film.

In a conventional fabrication method for a capacitor device including a capacitor dielectric film made from a ferroelectric film (hereinafter simply referred to as the ferroelectric memory), a lower electrode, the capacitor dielectric film made from the ferroelectric film and an upper electrode are successively formed on a semiconductor substrate, and the ferroelectric film is generally crystallized in the middle of the process for forming these elements.

A first conventional method for fabricating a ferroelectric memory will now be described with reference to FIGS. 7A through 7D.

First, as shown in FIG. 7A, on a semiconductor substrate 1 in which a pair of impurity diffusion layers (not shown) serving as a source region and a drain region have been formed, an insulting film 2 is formed, and then, a contact plug 3 in contact with one of the pair of impurity diffusion layers is formed in the insulating film 2. Thereafter, a first conducting film 4 that is made from a multilayer film of, for example, a Pt film and an $IrO_x$ film (oxygen barrier layer) and is used for forming a lower electrode, a ferroelectric film 5, and a second conducting film 6 of, for example, a Pt film are successively deposited on the insulating film 2.

Next, first annealing is performed in an oxygen atmosphere, so as to crystallize the ferroelectric film 5, and thus, a (crystallized) ferroelectric film 5A having a perovskite crystal structure is formed as shown in FIG. 7B.

Then, the second conducting film 6, the crystallized ferroelectric film 5A and the first conducting film 4 are successively patterned, thereby forming an upper electrode 6A from the second conducting film 6, a capacitor dielectric film 5B from the crystallized ferroelectric film 5A and a lower electrode 4A from the first conducting film 4 as shown in FIG. 7C.

Subsequently, second annealing is performed in an oxygen atmosphere, so that the crystal structure of the capacitor dielectric film 5B made from the crystallized ferroelectric film 5A, which has been damaged through plasma etching employed for the patterning, can be recovered.

Next, an interlayer insulating film 7 is deposited so as to cover a capacitor device including the upper electrode 6A, the capacitor dielectric film 5B and the lower electrode 4A as shown in FIG. 7D.

In the first conventional method, the perovskite crystal is grown from the faces of the ferroelectric film 5 respectively in contact with the first conducting film 4 and the second conducting film 6 through the first annealing performed in an oxygen atmosphere.

However, the plasma etching employed for patterning the second conducting film 6, the crystallized ferroelectric film 5A and the first conducting film 4 damages the capacitor dielectric film 5B made from the crystallized ferroelectric film 5A.

Therefore, the second annealing is performed in an oxygen atmosphere, so as to recover the damaged crystal structure of the capacitor dielectric film 5B.

A second conventional method for fabricating a ferroelectric memory disclosed in, for example, Japanese Laid-Open Patent Publication No. 11-297946 will now be described with reference to FIGS. 8A through 8D.

First, as shown in FIG. 8A, on a semiconductor substrate 1 in which a pair of impurity diffusion layers (not shown) serving as a source region and a drain region have been formed, an insulating film 2 is formed, and then, a contact plug 3 in contact with one of the pair of impurity diffusion layers is formed in the insulating film 2. Thereafter, a first conducting film 4 that is made from a multilayer film of, for example, a Pt film and an $IrO_x$ film (oxygen barrier layer) and is used for forming a lower electrode, a ferroelectric film 5 and a second conducting film 6 of, for example, a Pt film are successively deposited on the insulating film 2.

Next, the second conducting film 6, the ferroelectric film 5 and the first conducting film 4 are successively patterned, thereby forming an upper electrode 6A from the second conducting film 6, a patterned ferroelectric film 5C and a lower electrode 4A from the first conducting film 4 as shown in FIG. 8B.

Then, annealing is performed in an oxygen atmosphere, so as to crystallize the patterned ferroelectric film 5C. Thus, a (crystallized) ferroelectric film 5D having a perovskite crystal structure is formed as shown in FIG. 8C.

Subsequently, an interlayer insulating film 7 is deposited so as to cover a capacitor device including the upper electrode 6, the crystallized ferroelectric film 5D and the lower electrode 4 as shown in FIG. 8D.

In the second conventional method, after patterning the second conducting film 6, the ferroelectric film 5 and the first conducting film 4, the annealing is performed in an oxygen atmosphere so as to crystallize the patterned ferroelectric film 5C. Therefore, the crystallized ferroelectric film 5D can be prevented from being damaged by the plasma etching differently from the first conventional method, and hence, the resultant ferroelectric memory can attain a good characteristic.

However, when the capacitor device fabricated by the first or second conventional method is allowed to stand, a problem of characteristic degradation of the ferroelectric film occurs with the elapse of time. Specifically, an imprint phenomenon in which the polarization of the ferroelectric film is not inverted can occur, or the polarization of the ferroelectric film can be lowered.

Therefore, the reason why the characteristic of the ferroelectric film is degraded when the capacitor device is allowed stand has been variously examined. As a result, it has been found that the characteristic of the ferroelectric film is degraded because atmospheric moisture invades the ferroelectric film while the capacitor device is being left.

Also, it has been found that the characteristic of the ferroelectric film is degraded because the capacitor dielectric film is damaged in depositing an interlayer insulating film for covering the capacitor device.

SUMMARY OF THE INVENTION

In consideration of the above-described conventional problem, an object of the invention is preventing the characteristic degradation of a ferroelectric film used for forming a capacitor dielectric film.

In order to achieve the object, the first method for fabricating a capacitor device of this invention includes the steps of forming, on a substrate, a capacitor device including a lower electrode, a capacitor dielectric film made from a ferroelectric film and an upper electrode; forming an insulating film covering the capacitor device; and annealing the capacitor device covered with the insulating film for crystallizing the ferroelectric film.

In the first method for fabricating a capacitor device, the capacitor device covered with the insulating film is annealed for crystallizing the ferroelectric film, and therefore, the crystallized ferroelectric film is not exposed to the air. Accordingly, the characteristic of the ferroelectric film can be prevented from being degraded due to atmospheric moisture invasion of the ferroelectric film.

In the first method for fabricating a capacitor device, the insulating film is preferably an interlayer insulating film.

Thus, the insulating film for preventing the exposure of the capacitor device to the air can be used also as an interlayer insulating film, and hence, the degradation of the ferroelectric film can be prevented without increasing the number of procedures. Also, since the interlayer insulating film is deposited before the crystallization annealing of the capacitor device, the crystallized ferroelectric film can be prevented from being damaged in depositing the interlayer insulating film.

In the first method for fabricating a capacitor device, the insulating film is preferably a moisture invasion preventing film.

Thus, the atmospheric moisture can be definitely prevented from invading the ferroelectric film, and hence, the degradation in the characteristic of the ferroelectric film can be definitely avoided.

The first method for fabricating a capacitor device preferably further includes, between the step of forming, as an insulating film, the moisture invasion preventing film and the step of annealing the capacitor device, a step of forming an interlayer insulating film on the moisture invasion preventing film.

Thus, the atmospheric moisture invasion of the ferroelectric film can be more definitely prevented, and hence, the degradation in the characteristic of the ferroelectric film can be more definitely avoided.

The first method for fabricating a capacitor device preferably further includes, after the step of annealing the capacitor device, a step of forming a moisture invasion preventing film on the insulating film.

Thus, even when the insulating film is made from a film that cannot definitely prevent moisture invasion, such as a silicon oxide film, the atmospheric moisture invasion of the ferroelectric film can be prevented, and therefore, the degradation in the characteristic of the ferroelectric film can be definitely avoided.

In this case, the moisture invasion preventing film is formed preferably within 48 hours after annealing the capacitor device.

Thus, the lowering of the polarization of the ferroelectric film can be suppressed to 10% or less.

The first method for fabricating a capacitor device preferably further includes, between the step of forming an insulating film and the step of annealing the capacitor device, a step of forming a moisture invasion preventing film on the insulating film.

Thus, the atmospheric moisture can be more definitely prevented from invading the ferroelectric film, and hence, the degradation in the characteristic of the ferroelectric film can be more definitely avoided.

In the case where the first method for fabricating a capacitor device includes the step of forming a moisture invasion preventing film, the moisture invasion preventing film is preferably a single-layer film made from or a multilayer film including any of a silicon nitride film, a metal film, a metal nitride film and a metal oxide film.

Thus, the atmospheric moisture can be definitely prevented from invading the ferroelectric film.

The second method for fabricating a capacitor device of this invention includes the steps of forming, on a substrate, a capacitor device including a lower electrode, a capacitor dielectric film made from a ferroelectric film and an upper electrode; annealing the capacitor device for crystallizing the ferroelectric film; and forming a covering film for covering the capacitor device without exposing, to the air, the capacitor device having been annealed.

In the second method for fabricating a capacitor device, the capacitor device having been subjected to the crystallization annealing is not exposed to the air, and therefore, the characteristic of the ferroelectric film can be prevented from being degraded due to the atmospheric moisture invasion of the ferroelectric film.

In the second method for fabricating a capacitor device, the covering film is preferably an interlayer insulating film.

Thus, the covering film for preventing the exposure of the capacitor device to the air can be used also as an interlayer insulating film, and hence, the degradation of the ferroelectric film can be prevented without increasing the number of procedures.

The second method for fabricating a capacitor device preferably further includes a step of forming a moisture invasion preventing film on the interlayer insulating film within 48 hours after annealing the capacitor device.

Thus, the lowering of the polarization of the ferroelectric film can be suppressed to 10% or less.

In the second method for fabricating a capacitor device, the covering film is preferably a moisture invasion preventing film.

Thus, the atmospheric moisture can be definitely prevented from invading the crystallized ferroelectric film, and therefore, the degradation in the characteristic of the ferroelectric film can be definitely avoided.

In the case where the second method for fabricating a capacitor device includes the step of forming a moisture invasion preventing film, the moisture invasion preventing film is preferably a single-layer film made from or a multilayer film including any of a silicon nitride film, a metal film, a metal nitride film and a metal oxide film.

Thus, the atmospheric moisture can be definitely prevented from invading the ferroelectric film.

DETAILED DESCRIPTION OF THE INVENTION

Embodiment 1

A method for fabricating a capacitor device according to Embodiment 1 will now be described with reference to FIGS. 1A through 1D.

Figure 1A:
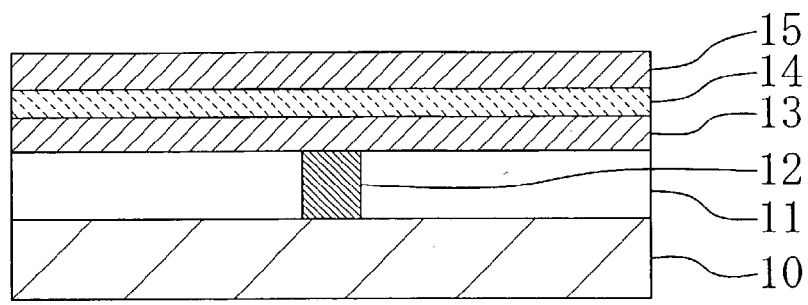
FIGS. 1A, 1B, 1C and 1D are cross-sectional views for showing procedures in a method for fabricating a capacitor device according to Embodiment 1 of the invention.

First, as shown in FIG. 1A, on a semiconductor substrate 10 in which a pair of impurity diffusion layers (not shown) serving as a source region and a drain region have been formed, an insulating film 11 is formed, and then, a contact plug 12 of, for example, a W film in contact with one of the pair of impurity diffusion layers is formed in the insulating film 11. Thereafter, a first conducting film 13 (with a thickness of 50 through 300 nm) that is made from a multilayer film of, for example, a Pt film and an $IrO_x$ film (oxygen barrier layer) and is used for forming a lower electrode, a ferroelectric film 14 (with a thickness of 50 through 300 nm) such as a SBT film or a PZT film, and a second conducting film 15 (with a thickness of 50 through 200 nm) of, for example, a Pt film are successively deposited on the insulating film 11. In the case where the ferroelectric film 14 is a SBT film, annealing is performed at a temperature lower than 700° C., and in the case where the ferroelectric film 14 is a PZT film, the annealing is performed at a temperature lower than 600° C., and the annealing is performed in order to remove an organic component included in the ferroelectric film. Accordingly, the ferroelectric film 14 is not annealed at a temperature exceeding the crystallization temperature, and hence does not have a perovskite structure.

Figure 1B:
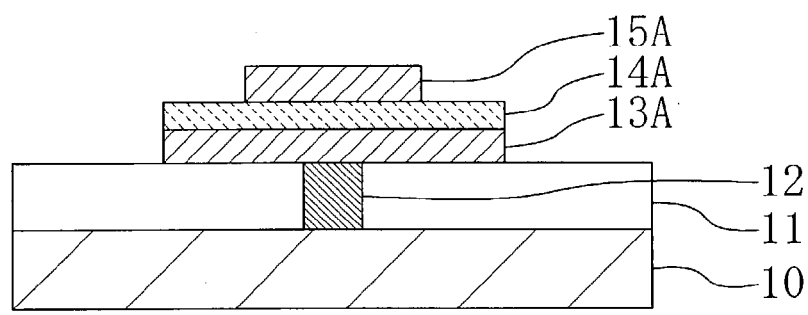

Next, as shown in FIG. 1B, the second conducting film 15, the ferroelectric film 14 and the first conducting film 13 are successively patterned, thereby forming an upper electrode 15A from the second conducting film 15, a capacitor dielectric film 14A from the ferroelectric film 14 and a lower electrode 13A from the first conducting film 13.

Figure 1C:
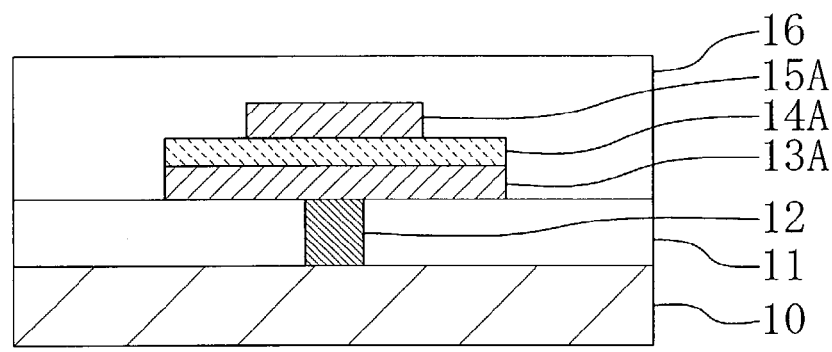

Then, as shown in FIG. 1C, an interlayer insulating film 16 (with a thickness of 50 through 500 nm) of, for example, a $SiO_2$ film is deposited on the insulating film 11 so as to cover a capacitor device including the upper electrode 15A, the capacitor dielectric film 14A and the lower electrode 13A.

Figure 1D:
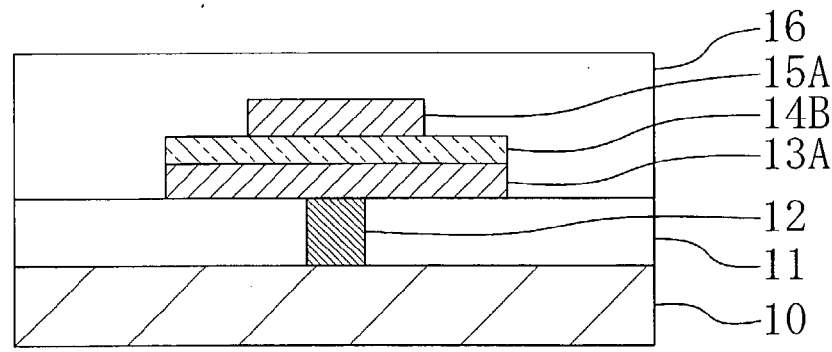

Thereafter, the capacitor device covered with the interlayer insulating film 16 is annealed at a temperature at which the ferroelectric film used for forming the capacitor dielectric film 14A can be crystallized, namely, at 700° C. or more in the case where the ferroelectric film is a SBT film and at 600° C. or more in the case where the ferroelectric film is a PZT film. Thus, the ferroelectric film is crystallized, resulting in forming a (crystallized) ferroelectric film 14B having a perovskite crystal structure as shown in FIG. 1D.

In Embodiment 1, the capacitor device covered with the interlayer insulating film 16 is subjected to the annealing for crystallizing the ferroelectric film. Therefore, the crystallized ferroelectric film is not exposed to the air, and hence, the characteristic degradation of the ferroelectric film derived from atmospheric moisture invasion of the ferroelectric film can be prevented.

Also, since the crystallization annealing is performed on the capacitor device after depositing the interlayer insulating film 16, the crystallized ferroelectric film 14B can be prevented from being damaged in depositing the interlayer insulating film 16.

In Embodiment 1, the upper electrode 15A, the capacitor dielectric film 14A and the lower electrode 13A are formed by successively patterning the second conducting film 15, the ferroelectric film 14 and the first conducting film 13. Instead, the ferroelectric film 14 and the second conducting film 15 may be deposited after forming the lower electrode 13A by patterning the first conducting film 13, or the ferroelectric film 14 may be deposited after forming the lower electrode 13A by patterning the first conducting film 13 and the second conducting film 15 may be deposited after patterning the ferroelectric film 14.

Modification of Embodiment 1

Figure 2:
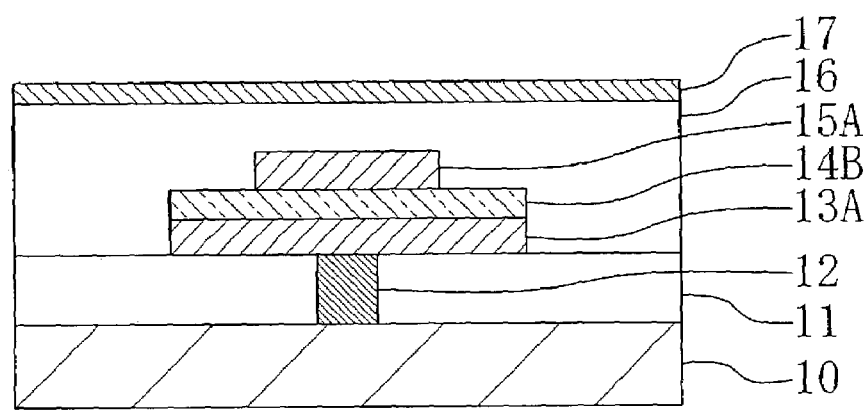
FIG. 2 is a cross-sectional view for showing a procedure in a method for fabricating a capacitor device according to a modification of Embodiment 1.

A method for fabricating a capacitor device according to a modification of Embodiment 1 will now be described with reference to FIGS. 2 and 3.

In the same manner as in Embodiment 1, an upper electrode 15A, a (crystallized) ferroelectric film 14B having a perovskite crystal structure, a lower electrode 13A and an interlayer insulating film 16 are formed as shown in FIG. 1D. Thereafter, a moisture invasion preventing film 17 is formed on the interlayer insulating film 16 as shown in FIG. 2. As the moisture invasion preventing film 17, a single-layer film of a silicon nitride film, a metal film, a metal nitride film (such as TiN or TiAlN) or a metal oxide film (such as $TiO_x$, TiAlO or $Al_2O_3$), or a multilayer film including any of these films can be used.

The moisture invasion preventing film 17 need not cover the whole face of the interlayer insulating film 16 but covers at least a region of the interlayer insulating film 16 above the capacitor device.

Since the interlayer insulating film 16 is formed over the capacitor device in Embodiment 1, the atmospheric moisture invasion of the ferroelectric film can be avoided. However, when the moisture invasion preventing film 17 is formed on the interlayer insulating film 16 as in the modification of Embodiment 1, the atmospheric moisture invasion of the ferroelectric film can be more definitely avoided.

Figure 3:
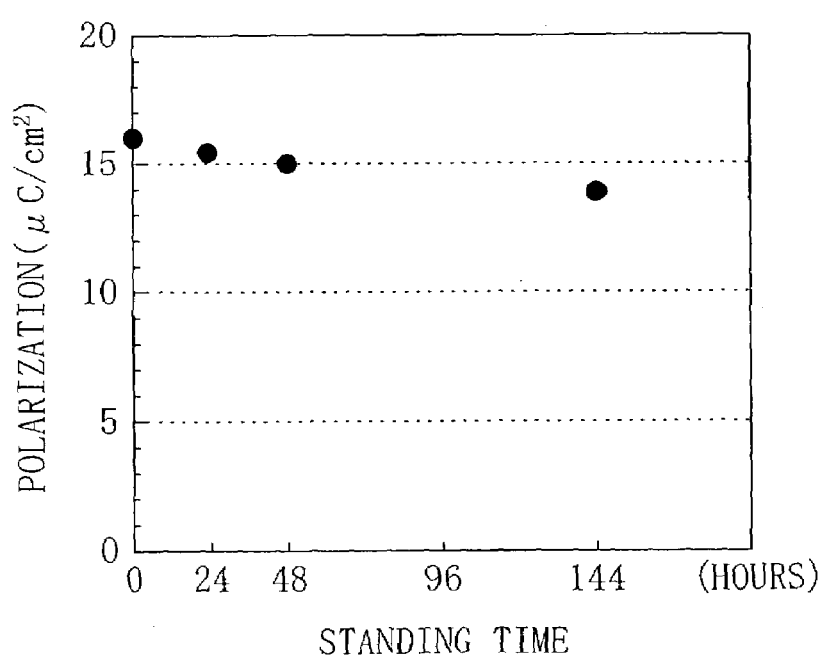
FIG. 3 is a diagram for showing the relationship, obtained in employing the method for fabricating a capacitor device according to the modification of Embodiment 1, between a standing time for allowing a capacitor device covered with an interlayer insulating film to stand in the air after crystallization annealing and the polarization of a ferroelectric film.

FIG. 3 shows the relationship between a standing time for allowing the capacitor device covered with the interlayer insulating film 16 to stand in the air after the crystallization annealing and the polarization of the ferroelectric film.

It is understood from FIG. 3 that the polarization is gradually lowered with the elapse of time, and that the polarization of the ferroelectric film is lowered by 10% or more when 48 hours or more elapse after the crystallization annealing. Accordingly, the moisture invasion preventing film 17 is formed on the interlayer insulating film 16 preferably within 48 hours after the crystallization annealing.

Embodiment 2

A method for fabricating a capacitor device according to Embodiment 2 will now be described with reference to FIGS. 4A through 4D.

Figure 4A:
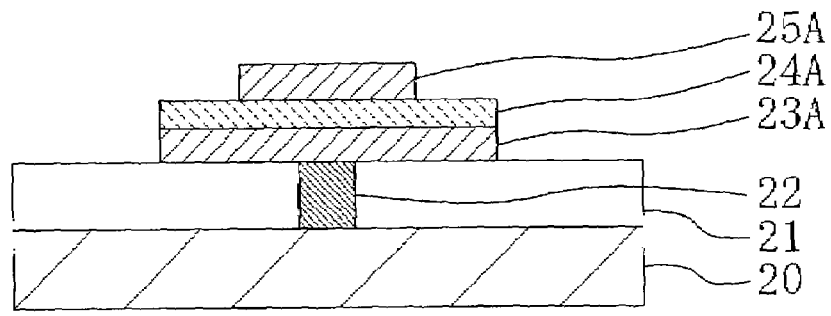
FIGS. 4A, 4B, 4C and 4D are cross-sectional views for showing procedures in a method for fabricating a capacitor device according to Embodiment 2 of the invention.

First, as shown in FIG. 4A, on a semiconductor substrate 20 in which a pair of impurity diffusion layers (not shown) serving as a source region and a drain region have been formed, an insulating film 21 is formed, and then, a contact plug 22 of, for example, a W film in contact with one of the pair of impurity diffusion layers is formed in the insulating film 21. Thereafter, a lower electrode 23A with a thickness of 50 through 300 nm made from a multilayer film of, for example, a Pt film and an $IrO_x$ film (oxygen barrier layer), a capacitor dielectric film 24A with a thickness of 50 through 300 nm made from a ferroelectric film such as a SBT film or a PZT film, and an upper electrode 25A with a thickness of 50 through 200 nm made from, for example, a Pt film are successively formed on the insulating film 21.

Figure 4B:
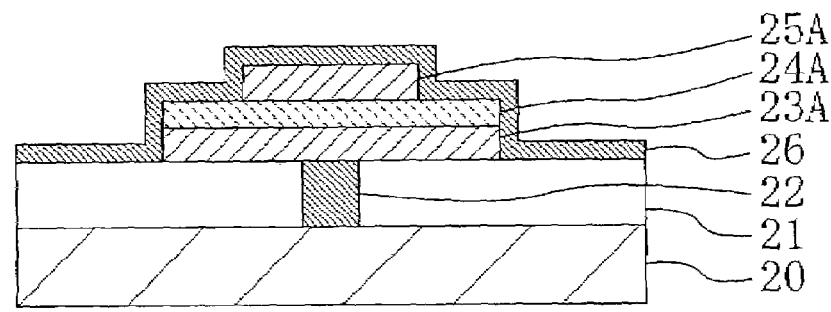

Next, as shown in FIG. 4B, a moisture invasion preventing film 26 is formed on the insulating film 21 so as to cover a capacitor device including the lower electrode 23A, the capacitor dielectric film 24A and the upper electrode 25A. As the moisture invasion preventing film 26, a single-layer film of a silicon nitride film, a metal film, a metal nitride film (such as TiN or TiAlN) or a metal oxide film (such as $TiO_x$, TiAlO or $Al_2O_3$), or a multilayer film including any of these films can be used. The moisture invasion preventing film 26 need not cover the whole face of the insulating film 21 but covers at least the capacitor device.

Figure 4C:
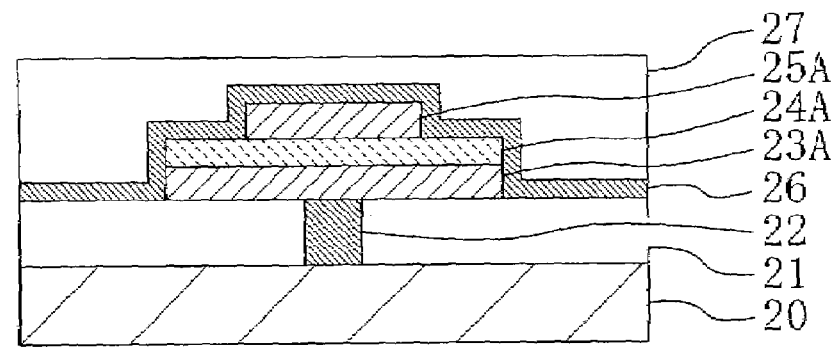

Then, as shown in FIG. 4C, an interlayer insulating film 27 with a thickness of 50 through 500 nm of, for example, a $SiO_2$ film is deposited on the moisture invasion preventing film 26.

Figure 4D:
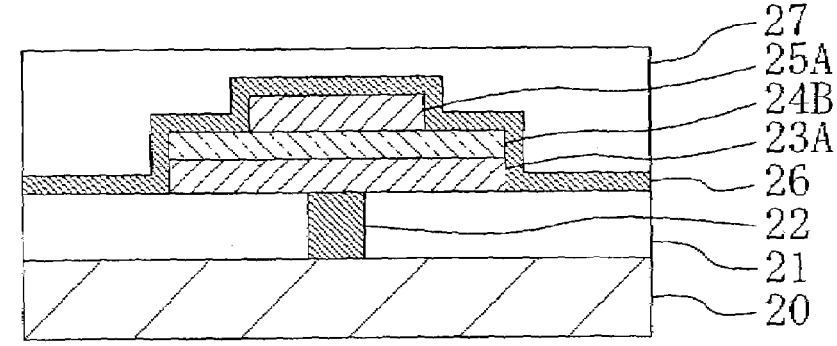

Subsequently, the capacitor device covered with the moisture invasion preventing film 26 and the interlayer insulating film 27 is annealed in an oxygen atmosphere at a temperature at which the ferroelectric film used for forming the capacitor dielectric film 24A can be crystallized. Thus, the ferroelectric film is crystallized, resulting in forming a (crystallized) ferroelectric film 24B having a perovskite crystal structure as shown in FIG. 4D.

The annealing for crystallizing the ferroelectric film is performed on the capacitor device covered with the moisture invasion preventing film 26 and the interlayer insulating film 27 in Embodiment 2. Therefore, the crystallized ferroelectric film 24B is not exposed to the air, and hence, the characteristic of the capacitor dielectric film can be definitely prevented from being degraded due to the atmospheric moisture invasion of the crystallized ferroelectric film 24B.

Also, since the crystallization annealing is performed on the capacitor device after depositing the interlayer insulating film 27, the crystallized ferroelectric film 24B can be prevented from being damaged in depositing the interlayer insulating film 27.

Embodiment 3

A method for fabricating a capacitor device according to Embodiment 3 will now be described with reference to FIGS. 5A through 5D.

Figure 5A:
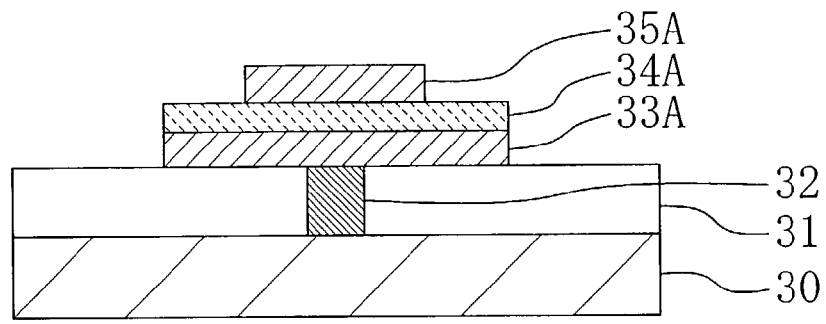
FIGS. 5A, 5B, 5C and 5D are cross-sectional views for showing procedures in a method for fabricating a capacitor device according to Embodiment 3 of the invention.

First, as shown in FIG. 5A, on a semiconductor substrate 30 in which a pair of impurity diffusion layers (not shown) serving as a source region and a drain region have been formed, an insulating film 31 is formed, and then, a contact plug 32 of, for example, a W film in contact with one of the pair of impurity diffusion layers is formed in the insulating film 31. Thereafter, a lower electrode 33A with a thickness of 50 through 300 nm made from a multilayer film of, for example, a Pt film and an $IrO_x$ film (oxygen barrier layer), a capacitor dielectric film 34A with a thickness of 50 through 300 nm made from a ferroelectric film such as a SBT film or a PZT film, and an upper electrode 35A with a thickness of 50 through 200 nm made from, for example, a Pt film are successively formed on the insulating film 31.

Figure 5B:
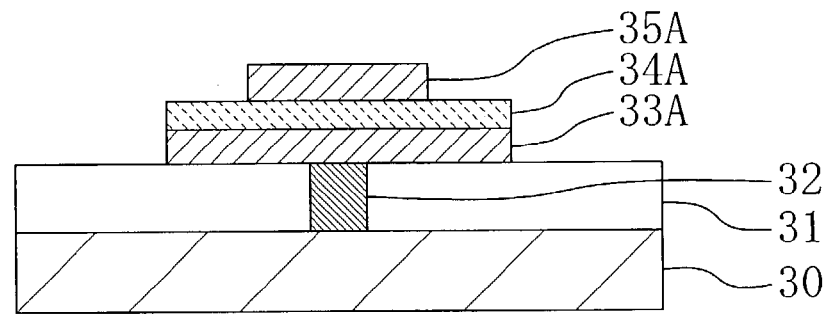

Next, as shown in FIG. 5B, an interlayer insulating film 36 (with a thickness of 50 through 500 nm) of, for example, a $SiO_2$ film is deposited on the insulating film 31 so as to cover a capacitor device including the lower electrode 33A, the capacitor dielectric film 34A and the upper electrode 35A.

Figure 5C:
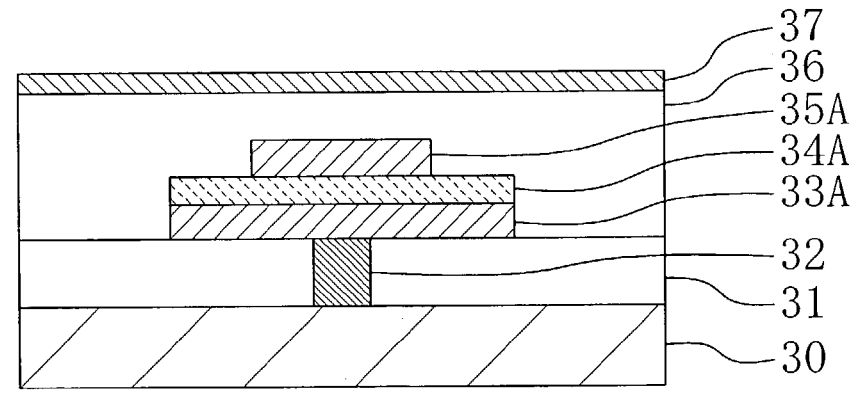

Then, as shown in FIG. 5C, a moisture invasion preventing film 37 is formed on the interlayer insulating film 36. As the moisture invasion preventing film 37, a single-layer film of a silicon nitride film, a metal film, a metal nitride film (such as TiN or TiAlN) or a metal oxide film (such as $TiO_x$, TiAlO or $Al_2O_3$), or a multilayer film including any of these films can be used. The moisture invasion preventing film 37 need not cover the whole face of the interlayer insulating film 36 but covers at least a region of the interlayer insulating film 36 above the capacitor device.

Figure 5D:
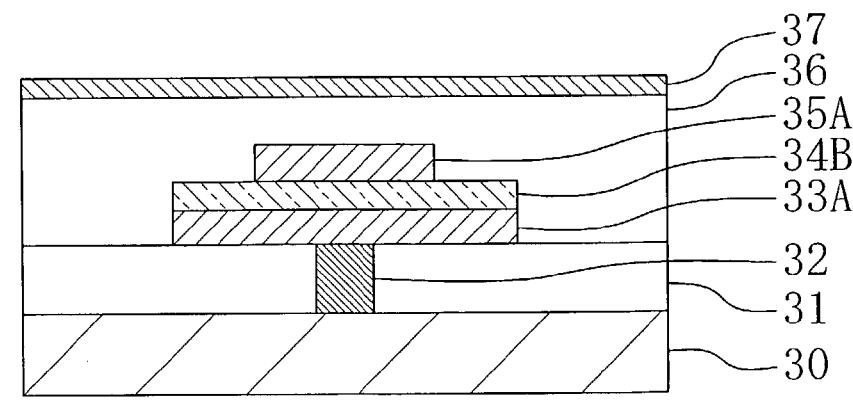

Subsequently, the capacitor device covered with the interlayer insulating film 36 and the moisture invasion preventing film 37 is annealed in an oxygen atmosphere at a temperature at which the ferroelectric film used for forming the capacitor dielectric film 34A can be crystallized. Thus, the ferroelectric film is crystallized, resulting in forming a (crystallized) ferroelectric film 34B having a perovskite crystal structure as shown in FIG. 5D.

The annealing for crystallizing the ferroelectric film is performed on the capacitor device covered with the interlayer insulating film 36 and the moisture invasion preventing film 37 in Embodiment 3. Therefore, the crystallized ferroelectric film 34B is not exposed to the air, and hence, the characteristic of the capacitor dielectric film can be more definitely prevented from being degraded due to the atmospheric moisture invasion of the ferroelectric film 34B.

Also, since the crystallization annealing is performed on the capacitor device after depositing the interlayer insulating film 36, the crystallized ferroelectric film 34B can be prevented from being damaged in depositing the interlayer insulating film 36.

Embodiment 4

A method for fabricating a capacitor device according to Embodiment 4 will now be described with reference to FIGS. 6A through 6D.

Figure 6A:
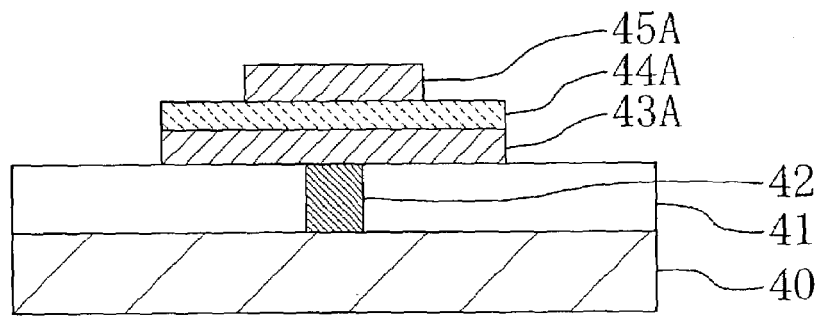
FIGS. 6A, 6B, 6C and 6D are cross-sectional views for showing procedures in a method for fabricating a capacitor device according to Embodiment 4 of the invention.

First, as shown in FIG. 6A, on a semiconductor substrate 40 in which a pair of impurity diffusion layers (not shown) serving as a source region and a drain region have been formed, an insulating film 41 is formed, and then, a contact plug 42 of, for example, a W film in contact with one of the pair of impurity diffusion layers is formed in the insulating film 41. Thereafter, a lower electrode 43A with a thickness of 50 through 300 nm made from a multilayer film of, for example, a Pt film and an $IrO_x$ film (oxygen barrier layer), a capacitor dielectric film 44A with a thickness of 50 through 300 nm made from a ferroelectric film such as a SBT film or a PZT film, and an upper electrode 45A with a thickness of 50 through 200 nm made from, for example, a Pt film are successively formed on the insulating film 41.

Figure 6B:
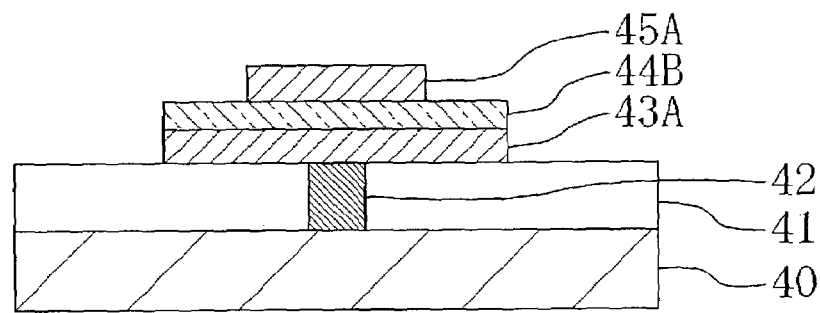
Figure 6C:
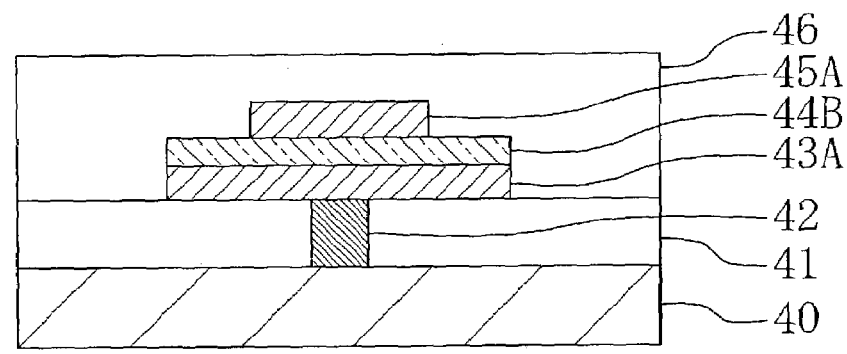

Next, a capacitor device including the lower electrode 43A, the capacitor dielectric film 44A and the upper electrode 45A is annealed in an oxygen atmosphere at a temperature at which the ferroelectric film used for forming the capacitor dielectric film 44A can be crystallized. Thus, the ferroelectric film is crystallized, resulting in forming a (crystallized) ferroelectric film 44B having a perovskite crystal structure as shown in FIG. 6B. Thereafter, the capacitor device is kept in a state not exposed to the air. Specifically, the capacitor device is kept in an atmosphere including substantially no moisture, such as in vacuum, an oxygen atmosphere or a nitrogen atmosphere.

Then, with the capacitor device kept in the state not exposed to the air, an interlayer insulating film 46 with a thickness of 50 through 500 nm of, for example, a SiO$_2$ film is deposited on the insulating film 41. Specifically, the capacitor device having been annealed in an oxygen atmosphere is moved, without exposing to the air, to a vacuum chamber connected to a film forming chamber, and then, it is moved back from the vacuum chamber to the film forming chamber for depositing the interlayer insulating film 46. Thus, the interlayer insulating film 46 covering the capacitor device can be deposited without exposing the capacitor device including the crystallized ferroelectric film 44B to the air.

Figure 6D:
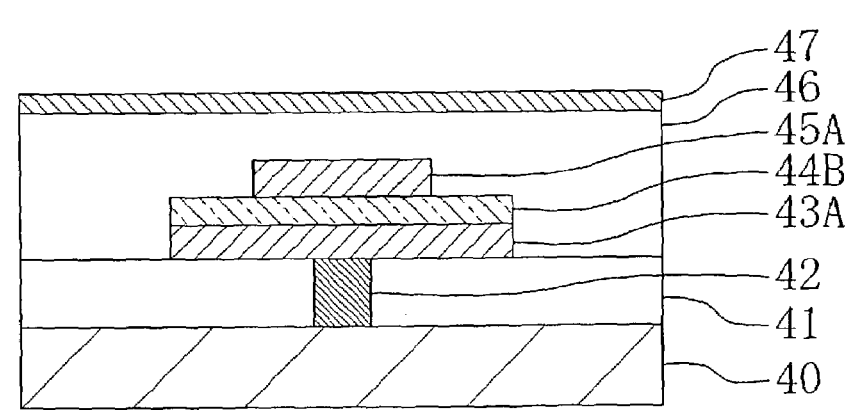
Figure 7A:
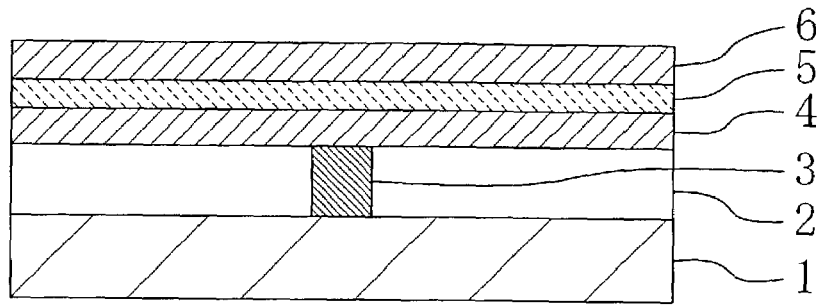
FIGS. 7A, 7B, 7C and 7D are cross-sectional views for showing procedures in a first conventional method for fabricating a capacitor device.
Figure 7B:
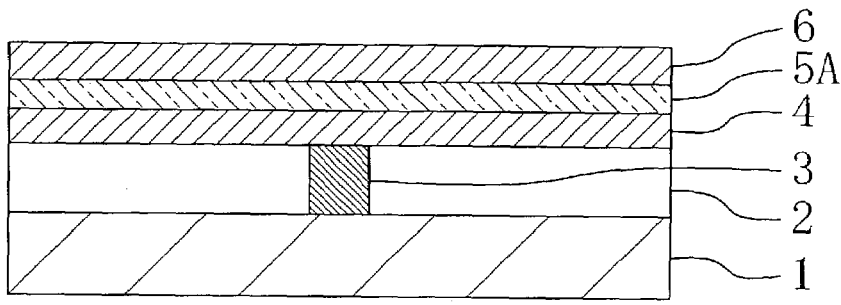
Figure 7C:
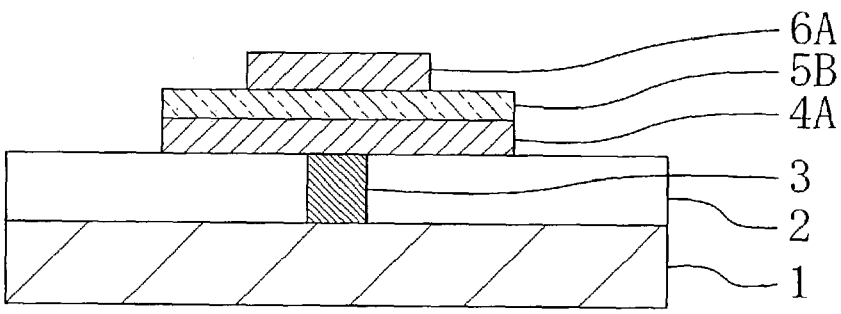
Figure 7D:
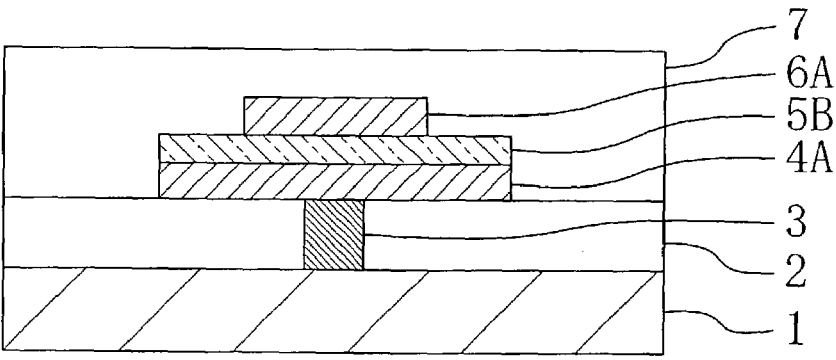
Figure 8A:
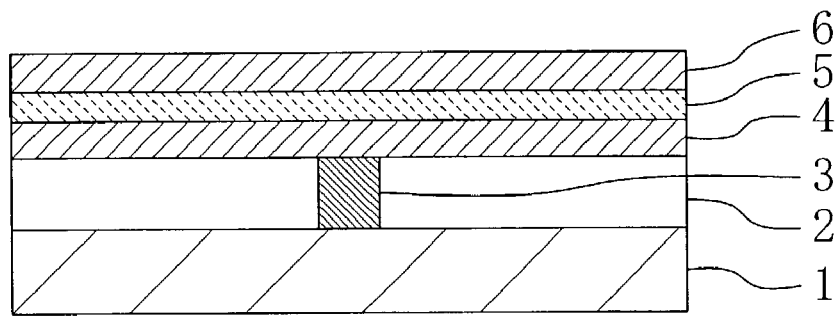
FIGS. 8A, 8B, 8C and 8D are cross-sectional views for showing procedures in a second conventional method for fabricating a capacitor device.
Figure 8B:
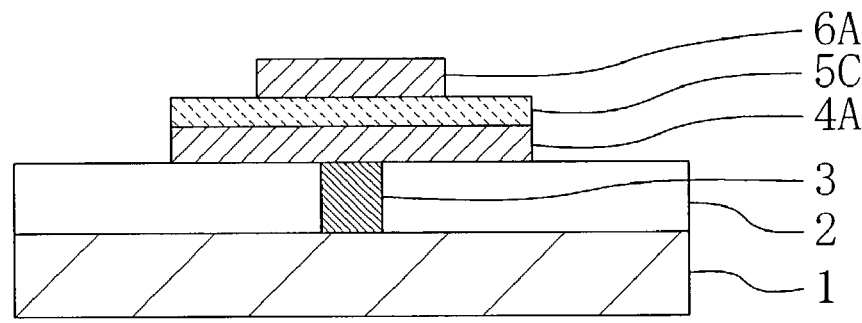
Figure 8C:
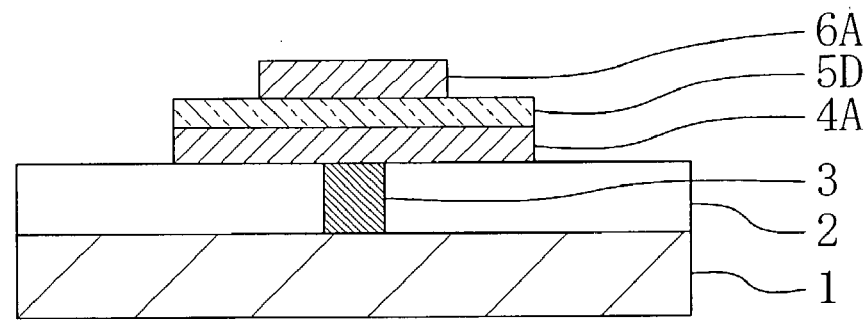
Figure 8D:
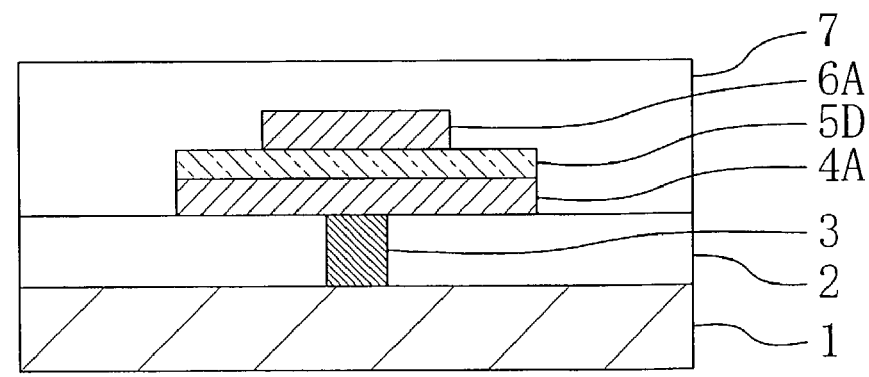

Subsequently, as shown in FIG. 6D, a moisture invasion preventing film 47 is formed on the interlayer insulating film 46. As the moisture invasion preventing film 47, a single-layer film of a silicon nitride film, a metal film, a metal nitride film (such as TiN or TiAlN) or a metal oxide film (such as TiO$_x$, TiAlO or Al$_2$O$_3$), or a multilayer film including any of these films can be used. The moisture invasion preventing film 47 need not cover the whole face of the interlayer insulating film 46 but covers at least a region of the interlayer insulating film 46 above the capacitor device. In this case, the moisture invasion preventing film 47 is formed on the interlayer insulating film 46 preferably within 48 hours after the crystallization annealing. Thus, the lowering of the polarization of the ferroelectric film can be suppressed to 10% or less.

The interlayer insulating film 46 and the moisture invasion preventing film 47 covering the capacitor device are formed without exposing, to the air, the capacitor device having been subjected to the crystallization annealing in Embodiment 4. Therefore, the crystallized ferroelectric film 44B is not exposed to the air, and hence, the characteristic of the capacitor dielectric film can be more definitely prevented from being degraded due to the atmospheric moisture invasion of the crystallized ferroelectric film 44B.

What is claimed is:

1. A method for fabricating a capacitor device comprising the steps of:
    forming, on a substrate, a capacitor device including a lower electrode, a capacitor dielectric film made of a ferroelectric film having no perovskite structure and an upper electrode;
    forming an insulating film over said capacitor device such that said insulating film covers the top surface and side surfaces of said capacitor device; and
    after the step of forming said insulating film, annealing said capacitor device, during which said insulating film is directly on the entire top surface of said capacitor device, to crystallize said ferroelectric film having no perovskite structure,
    wherein said insulating film is a silicon oxide film.

2. The method for fabricating a capacitor device of claim 1, further comprising, after the step of annealing said capacitor device, a step of forming a moisture invasion preventing film on said insulating film.

3. The method for fabricating a capacitor device of claim 2, wherein said moisture invasion preventing film is formed within 48 hours after annealing said capacitor device.

4. The method for fabricating a capacitor device of claim 2, wherein said moisture invasion preventing film is a single-layer film of a silicon nitride film, a metal film, a metal nitride film or a metal oxide film, or a multilayer film including any of a silicon nitride film, a metal film, a metal nitride film and a metal oxide film.

5. The method for fabricating a capacitor device of claim 1, further comprising, between the step of forming said insulating film and the step of annealing said capacitor device, a step of forming a moisture invasion preventing film on said insulating film.

6. The method for fabricating a capacitor device of claim 5, wherein said moisture invasion preventing film is a single-layer film of a silicon nitride film, a metal film, a metal nitride film or a metal oxide film, or a multilayer film including any of a silicon nitride film, a metal film, a metal nitride film and a metal oxide film.

7. The method for fabricating a capacitor device of claim 1, wherein said annealing is performed in an oxygen atmosphere.

8. The method for fabricating a capacitor device of claim 1, wherein said ferroelectric film having no perovskite structure is made of Sr, Bi and Ta, or made of Pb, Zr and Ti.

9. The method for fabricating a capacitor device of claim 1, wherein at least one of said upper electrode and said lower electrode is made from platinum.

10. The method for fabricating a capacitor device of claim 1, wherein said ferroelectric film being crystallized by said annealing has a perovskite crystal structure; and
    said crystallized ferroelectric film is not exposed to the atmosphere after said annealing.

11. The method for fabricating a capacitor device of claim 1, wherein during the annealing step said insulating film is directly on the entire side surfaces of said capacitor device.

12. A method for fabricating a capacitor device comprising the steps of:
    forming, on a substrate, a lower electrode;
    forming, on said lower electrode, a capacitor dielectric film made of a ferroelectric film having no perovskite structure;
    after the step of forming said capacitor dielectric film, performing first annealing to remove an organic component included in said ferroelectric film having no perovskite structure;
    after the step of said first annealing, forming a capacitor device by forming, on said ferroelectric film, an upper electrode;
    forming an insulating film over said capacitor device such that said insulating film covers the top surface and side surfaces of said capacitor device; and
    after the step of forming said insulating film, performing second annealing with respect to said capacitor device, during which said insulating film is directly on the entire top surface of said capacitor device, to crystallize said ferroelectric film having no perovskite structure,
    wherein said insulating film is a silicon oxide film.

13. The method for fabricating a capacitor device of claim 12, wherein said first annealing is performed at a temperature in which said ferroelectric film having no perovskite structure is not crystallized.

14. The method for fabricating a capacitor device of claim 13, wherein said second annealing is performed in an oxygen atmosphere.

15. The method for fabricating a capacitor device of claim 12, further comprising, after the step of performing said second annealing with respect to said capacitor device, a step of forming a moisture invasion preventing film on said insulating film.

16. The method for fabricating a capacitor device of claim 15, wherein said moisture invasion preventing film is formed within 48 hours after performing said second annealing with respect to said capacitor device.

17. The method for fabricating a capacitor device of claim 15, wherein said moisture invasion preventing film is a single-layer film made from or a multilayer film including any of a silicon nitride film, a metal film, a metal nitride film and a metal oxide film.

18. The method for fabricating a capacitor device of claim 12, further comprising, between the step of forming an insulating film and the step of performing said second annealing with respect to said capacitor device, a step of forming a moisture invasion preventing from on said insulating film.

19. The method of fabricating a capacitor device of claim 18, wherein said moisture invasion preventing film is a single-layer film made of a silicon nitride film, a metal film, a metal nitride film or a metal oxide film, or a multilayer film including any of a silicon nitride film, a metal film, a metal nitride film and a metal oxide film.

20. The method for fabricating a capacitor device of claim 12, wherein said ferroelectric film having no perovskite structure is made of Sr, Bi and Ta, or made of Pb, Zr and Ti.

21. The method for fabricating a capacitor device of claim 12, wherein at least one of said upper electrode and said lower electrode is made from platinum.

22. The method for fabricating a capacitor device of claim 12, wherein said ferroelectric film being crystallized by said second annealing has a perovskite crystal structure; and
    said crystallized ferroelectric film is not exposed to the atmosphere after said second annealing.

23. The method far fabricating a capacitor device of claim 12, wherein during the second annealing step said insulating film is directly on the entire side surfaces of said capacitor device.

* * * * *